US006713811B2

(12) United States Patent
Hsieh

(10) Patent No.: US 6,713,811 B2
(45) Date of Patent: Mar. 30, 2004

(54) SPLIT GATE FLASH WITH STRONG SOURCE SIDE INJECTION AND METHOD OF FABRICATION THEREOF

(75) Inventor: Chia-Ta Hsieh, Tainan (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 20 days.

(21) Appl. No.: 10/152,107

(22) Filed: May 21, 2002

(65) Prior Publication Data
US 2003/0218203 A1 Nov. 27, 2003

(51) Int. Cl.⁷ .......................................... H01L 29/788
(52) U.S. Cl. ....................................... 257/316; 257/315
(58) Field of Search ................................. 257/316, 315

(56) References Cited

U.S. PATENT DOCUMENTS

| | | | |
|---|---|---|---|
| 5,587,332 A | 12/1996 | Chang et al. .................. | 437/43 |
| 5,917,215 A | 6/1999 | Chuang et al. ............. | 257/321 |
| 6,093,608 A | 7/2000 | Lin et al. .................... | 438/266 |
| 6,124,609 A | 9/2000 | Hsieh et al. ................. | 257/315 |
| 6,291,853 B1 * | 9/2001 | Io ............................... | 257/315 |
| 6,563,166 B1 * | 5/2003 | Ni ............................... | 257/316 |

* cited by examiner

Primary Examiner—David Nelms
Assistant Examiner—Tu-Tu Ho
(74) Attorney, Agent, or Firm—George O. Saile; Stephen B. Ackerman

(57) ABSTRACT

A new split gate structure is disclosed with improved programming efficiency. A silicon region, extending to the surface of a semiconductor substrate, has parallel source/drain regions and electrical connecting regions disposed over the source/drain region. A multiplicity of structures is situated between source drain regions. Each structure is composed of two tower structures and intervening oxide layers. A floating gate tower, in which a gate oxide layer separates a floating gate from said silicon region and an insulating layer separates said floating gate from a top gate, with a nitride layer disposed over the top gate. And a selected gate tower in which a silicon pedestal is in intimate electrical contact with said silicon region and said silicon pedestal is separated from a selected gate by an insulating layer. Along the interfacing sidewalls, the silicon pedestal is separated from the floating gate by a first intervening oxide layer and the selected gate is separated from the floating gate tower by a second intervening oxide layer.

54 Claims, 7 Drawing Sheets

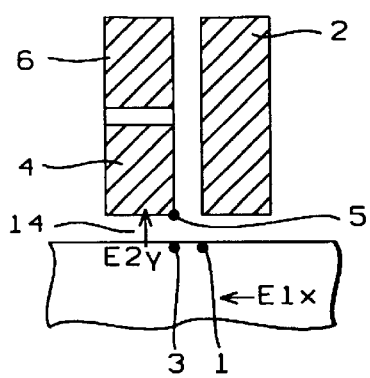
FIG. 1 - Prior Art
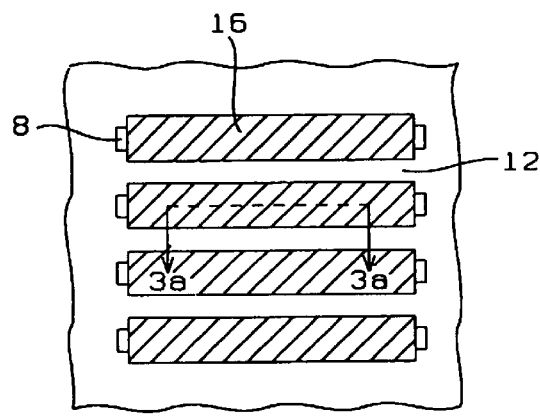
FIG. 2a
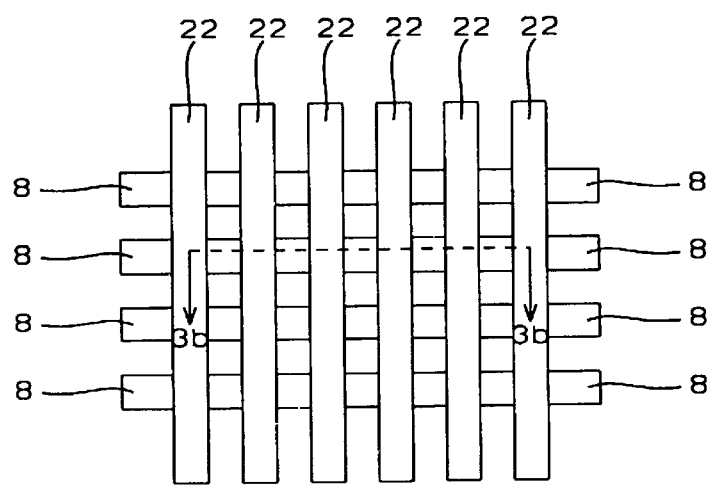
FIG. 2b

SPLIT GATE FLASH WITH STRONG SOURCE SIDE INJECTION AND METHOD OF FABRICATION THEREOF

BACKGROUND OF THE INVENTION (1) Field of the Invention

The present invention relates generally to semiconductor integrated circuit technology and more particularly to split gate memory cells used in flash EPROMs (Electrically Erasable Programmable Read Only Memory).

(2) Description of Prior Art

A basic operation in split gate flash EPROMs is the programming operation. In the programming operation charge is introduced into the floating gate of the split gate flash memory cell. Traditionally programming by source side injection, the introduction of charge into the floating gate, is accomplished in two steps. In the first step, channel electrons are heated by the electric field parallel to the channel so that when they are opposite the floating gate there is a significant number of electrons with increased energy. Secondly, the electrons must overcome the gate oxide potential barrier to pass into the floating gate. The higher the electron energy and the electric field normal to the channel the easier it is to penetrate the barrier and the more efficient the charging of the floating gate. This two step process is shown in FIG. 1. Electrons in the channel at point 1, under selected gate 2, are accelerated in passing to point 3, under the floating gate 4, by a field E1x, which is determined by the potential difference, V31, between points 3 and 1. The voltage of the selected gate, which should be low, determines the potential at point 1. The voltage applied to the top gate, 6, determines the voltage of the floating gate to which it is coupled. The voltage of the floating gate, which should be high, in turn determines the voltage at point 3. The larger is V31 the larger is the hot electron generation rate, the rate at which electrons gain energy. To enter the floating gate, such as by going from point 3 to point 5, channel electrons need to traverse the potential barrier posed by the gate oxide, 14. The rate at which electrons traverse the gate oxide barrier depends on the electron energy, the direction of the electron's motion relative to the barrier, and the electric field, E2y, across the barrier. The electric field E2y is determined by the voltage of the floating gate, which is determined by the voltage applied to the top gate. Higher electron energy, motion more normal to the barrier and higher fields across the barrier are favorable for barrier penetration. E1x, which is perpendicular to E2y, determines electron energy and thus these two fields act independently. Furthermore the action of E1x is to accelerate electrons along the direction of the channel, which is in a direction parallel to the barrier or the least efficient direction. Only electrons that scatter and who's scattering angle is near a right angle, so that after scattering they are moving normal to the barrier, will have a reasonable probability of traversing the barrier. To overcome these distractions in the efficiency of charging the floating gate, high voltages need be applied to the top gate. However, high voltages result in decreased reliability. It is a major objective of the invention to provide a split gate flash structure with increased floating gate charging efficiency that requires lower top gate applied voltage and thus possesses increased reliability.

Hsieh et al., U.S. Pat. No. 6,124,609, shows a split gate flash memory cell with source side injection having reduced size, partially buried source line, increased source coupling ratio, improved programmability and overall enhanced performance. U.S. Pat. No. 6,093,608 to Lin et al. shows a p-channel split gate flash memory cell with source side injection programming and tip erasing. U.S. Pat. No. 5,917,215 to Chuang et al. show stepped edge structure for an EEPROM tunneling window that eliminates the oxide thinning affect. U.S. Pat. No. 5,587,332 to Chang et al. relates to a flash EEPROM cell using polysilicon-to-polysilicon hot electron emission to erase the memory content of the cell.

SUMMARY OF THE INVENTION

It is a primary objective of the invention to provide a split gate flash structure with increased source side injection efficiency. It is another primary objective of the invention to provide a split gate flash structure that requires lower top gate applied voltage and thus possesses increased reliability. Yet another primary objective is to provide a split gate flash structure whose cell size decrease is not limited by the circuitry required to deliver the high voltage needed for traditional source side injection. It is yet another primary objective of the invention to provide a method to fabricate a split gate flash structure with increased source side injection efficiency. It is yet another primary objective of the invention to provide a method to fabricate a split gate flash structure that requires lower top gate applied voltage and thus possesses increased reliability. Yet another primary objective is to provide a method to fabricate a split gate flash structure whose cell size decrease is not limited by the circuitry required to deliver the high voltage needed for traditional source side injection.

These objectives are achieved in the invention by a split gate flash structure in which source side programming is accomplished with the heating electric field normal to the floating gate oxide barrier, and thus in the same direction as the electric field across the floating gate oxide barrier. This results in a significant increase in injection efficiency. Consequently, the top gate voltage need not be so high, which eliminates the need for special circuitry to achieve high voltage and thus facilitates decreasing the cell size. In addition, lower voltage results in improved reliability.

A new split gate structure is disclosed with improved programming efficiency. A silicon region, extending to the surface of a semiconductor substrate, has parallel source/drain regions and electrical connecting regions disposed over the source/drain region. A multiplicity of structures is situated between source drain regions. Each structure is composed of two tower structures and intervening oxide layers. A floating gate tower, in which a gate oxide layer separates a floating gate from said silicon region and an insulating layer separates said floating gate from a top gate, with a nitride layer disposed over the top gate. And a selected gate tower in which a silicon pedestal is in intimate electrical contact with said silicon region and said silicon pedestal is separated from a selected gate by an insulating layer. Along the interfacing sidewalls, the silicon pedestal is separated from the floating gate by a first intervening oxide layer and the selected gate is separated from the floating gate tower by a second intervening oxide layer.

BRIEF DESCRIPTION OF THE DRAWINGS

In the accompanying drawing forming a material part of this description, there is shown:

FIG. 1 shows traditional programming by source side injection.

FIGS. 2a–2f show cross sectional views depicting a method of forming split gate flash memory cells according to the invention.

DESCRIPTION OF THE PREFERRED EMBODIMENTS

Figure 2C:
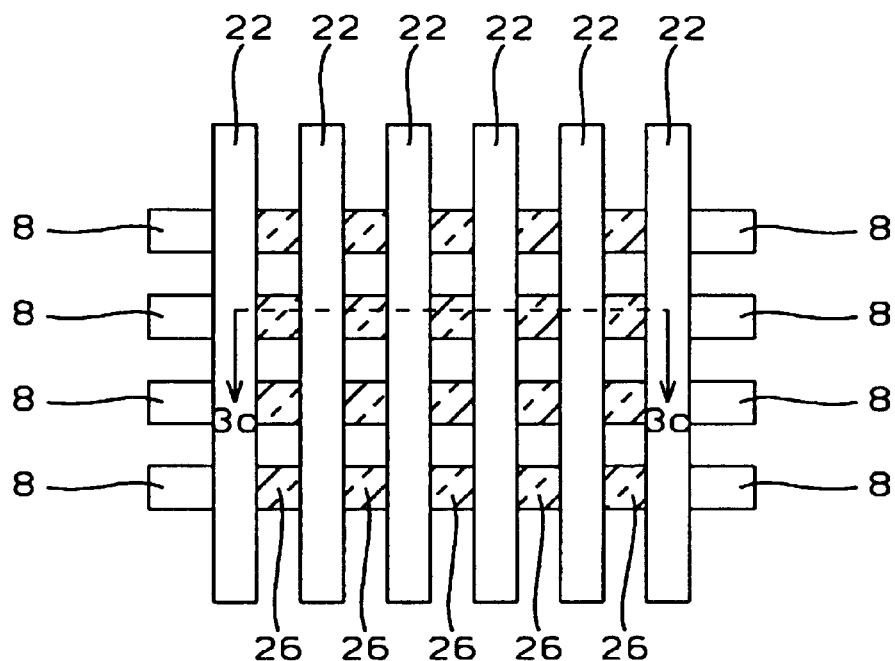
Figure 2D:
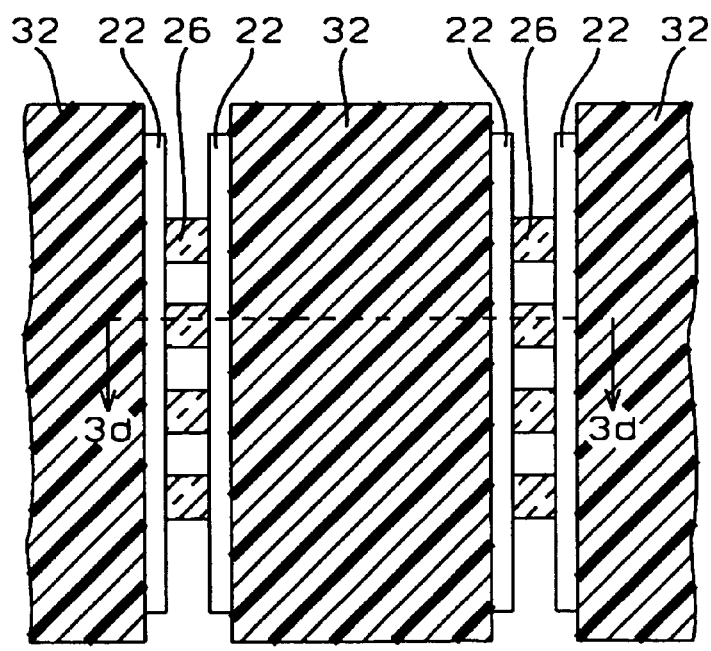
Figure 2E:
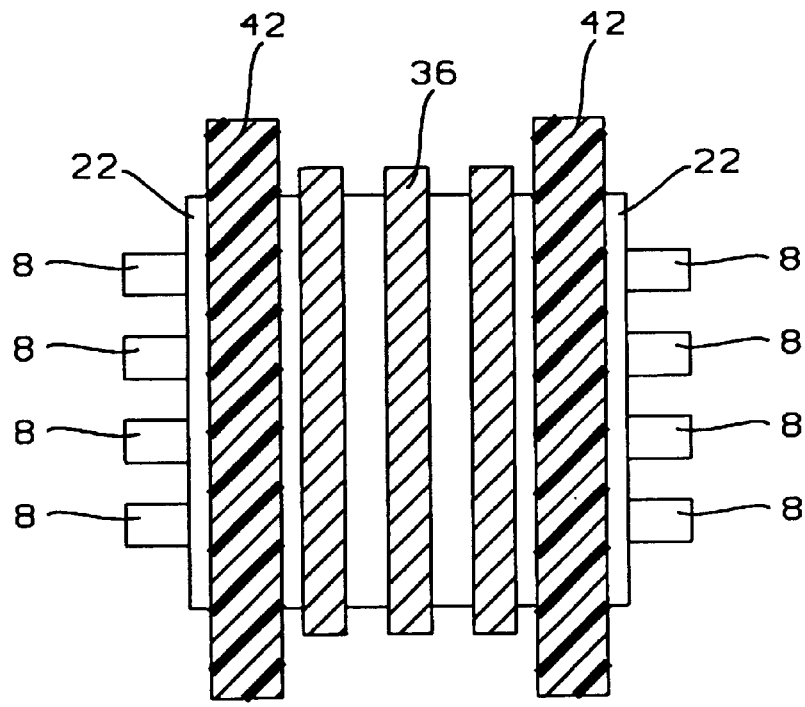
Figure 2F:
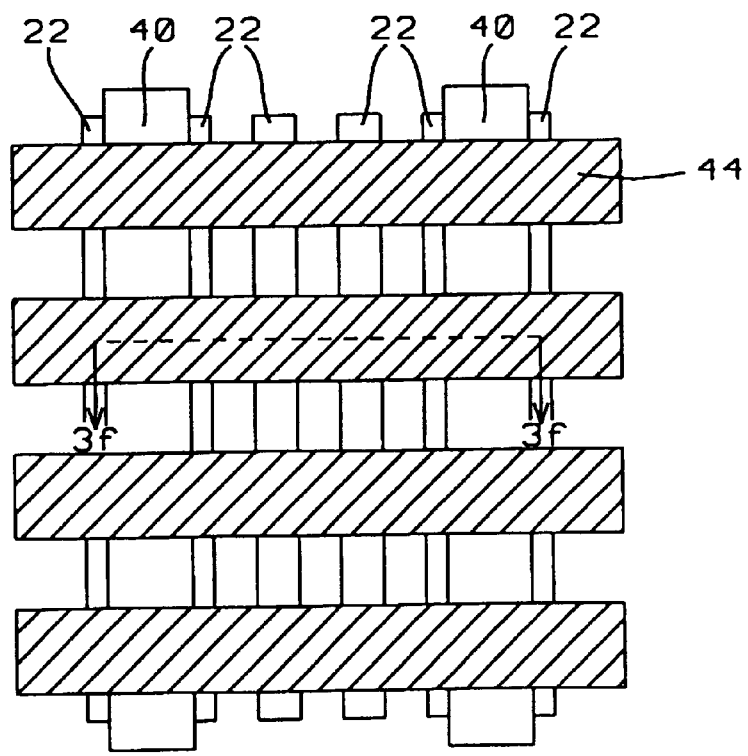
Figure 3A:
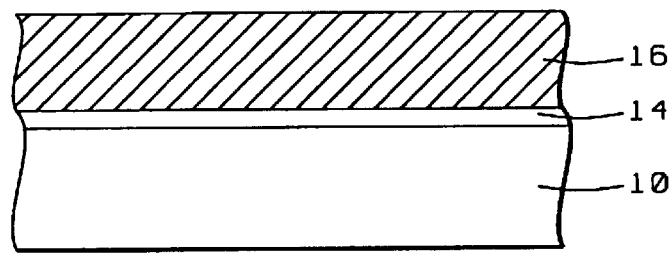
FIGS. 3a–3f show top views depicting a method of forming split gate flash memory cells according to the invention.
Figure 3B:
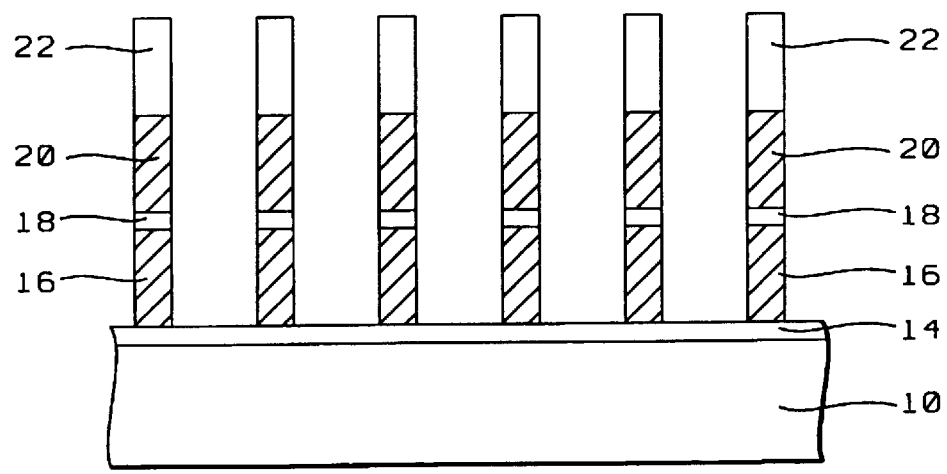

Preferred embodiments of the invention are well described with the aid of FIGS. 2a–2f and 3a–3f. A method of fabricating a novel split gate flash memory cell with strong source side injection is presented in FIGS. 2a–2f, where top views of the cell are presented at successive stages of the process and in FIGS. 3a–3f, which show the corresponding cross-sectional views. Active regions, 8, are defined on a p-type semiconductor region, 10, which preferably is a silicon substrate, using isolation regions, such as shallow trench isolation, STI, regions, 12. An implant is performed to adjust the cell threshold voltage, which may be a boron implant at about 20 keV to a dose of about 5E11 per sq. cm. The floating gate oxide 1, 14, is then formed to a thickness of about 150 Angstroms, followed by deposition of a conductive layer, which preferably is a poly 1 layer, 16, to a depth of about 800 Angstroms. A photoresist layer is formed and patterned to partially define the poly 1 floating gates. After a poly 1 etch, to achieve the shape of region 16 as shown in FIG. 2a, and removal of the photoresist, the structure is as depicted in FIGS. 2a and 3a.

Figure 3C:
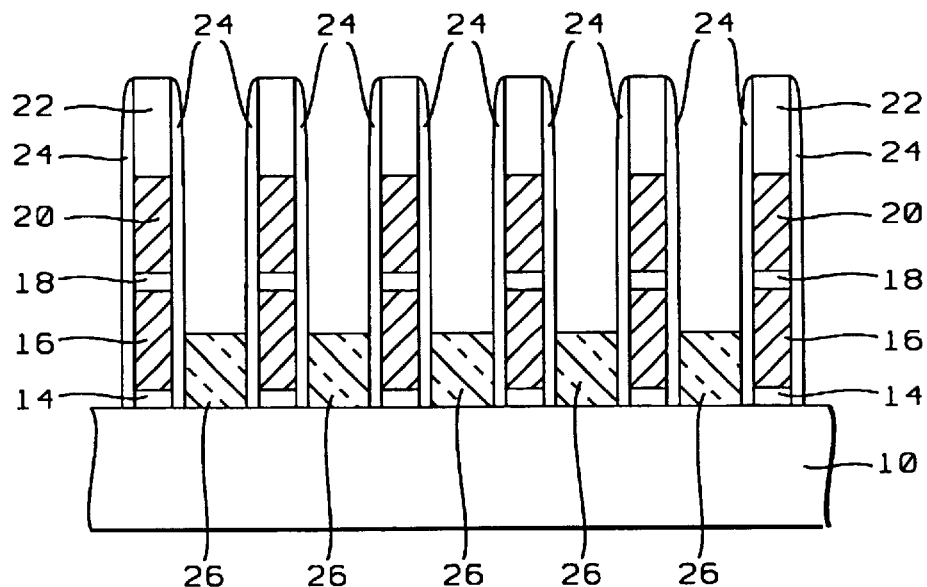

The method of the invention continues with formation of a dielectric separator, 18, between the poly 1 floating gate and a poly 2 control gate that is disposed over the dielectric separator. This dielectric separator often consists of composite oxide/nitride/oxide (ONO) layers, with the layer thickness being about 75, 150, 30 Angstroms, respectively. There follows a deposition of a conductive layer, 20, which preferably is about 1000 Angstroms of poly 2 and then deposition of about 1500 Angstroms of nitride 1, 22, which is preferably a silicon nitride layer. A photoresist layer is formed and patterned to define the control gates. Etching the nitride layer, the poly 2 layer and the ONO layer and then removing the photoresist results in the structure depicted in FIGS. 2b and 3b. The ONO layer, 18, provides dielectric separation between the poly 2 layer, 20, which acts as a top gate, and the poly 1 floating gate, 16. The nitride 1 layer, 22, is required for dielectric separation between poly 2 and subsequent poly layers. Next, a second oxide layer is deposited, which preferably is about 300 Angstroms of high temperature oxide (HTO). This second oxide layer is then etched to form sidewall spacers 24, as seen in FIG. 3c. The next step is basic to the invention. A stepped substrate is constructed so that during programming electrons are accelerated toward the floating gate. This is accomplished using selective epitaxial growth (SEG) to form silicon pedestals, 26, directly on the silicon substrate, with the height of the silicon pedestals being greater than the thickness of gate oxide 1. There cannot be any native oxide or any other intervening layer between the SEG pedestals and the silicon substrate, since the SEG layer will form only over silicon. The structure at this stage of the process is as shown in FIGS. 2c and 3c.

Figure 3D:
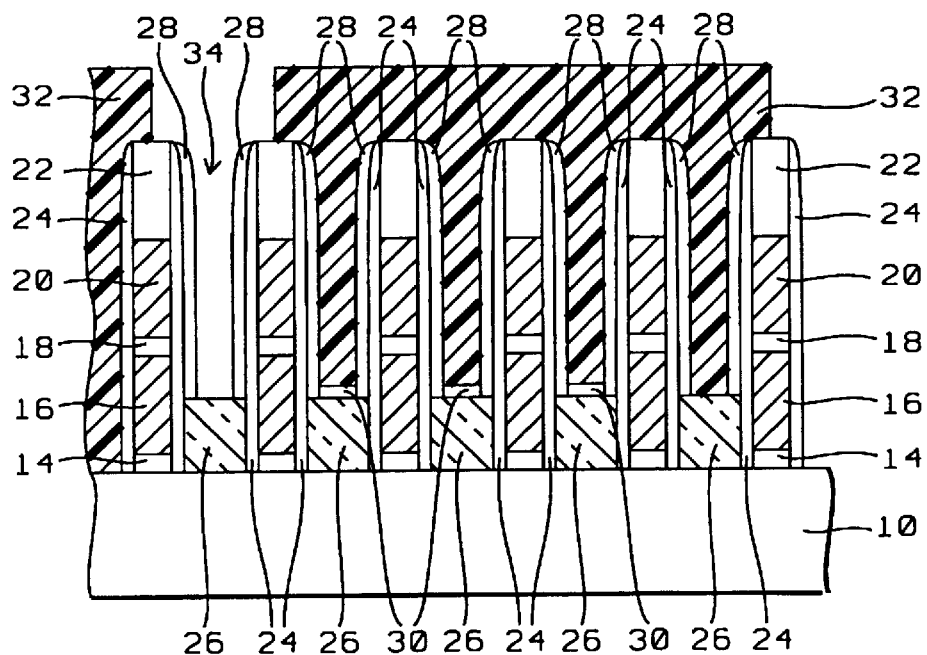

A third oxide layer is deposited, which preferably is about 200 Angstroms of HTO. An implant is performed to adjust the selected gate threshold voltage, which preferably is a BF2 implant at energy of about 15 keV and to a dose of about 4E12 per cm2. Etching of the HTO oxide 3 follows, to form sidewall spacers 28. A fourth oxide layer, 30, is grown over the SEG pedestals to a thickness of about 150 Angstroms. A photoresist layer, 32, is formed to define source/drain openings 34. Source/drain implantation is performed, which is preferably an As implant, of energy about 70 keV, to a dose of about 3E15 per cm2. The fourth oxide layers on the SEG pedestals of the source/drain openings are now etched, so electrical contact can be made to the source/drain regions. At this stage of the process the structure is as shown in FIGS. 2d and 3d.

Figure 3E:
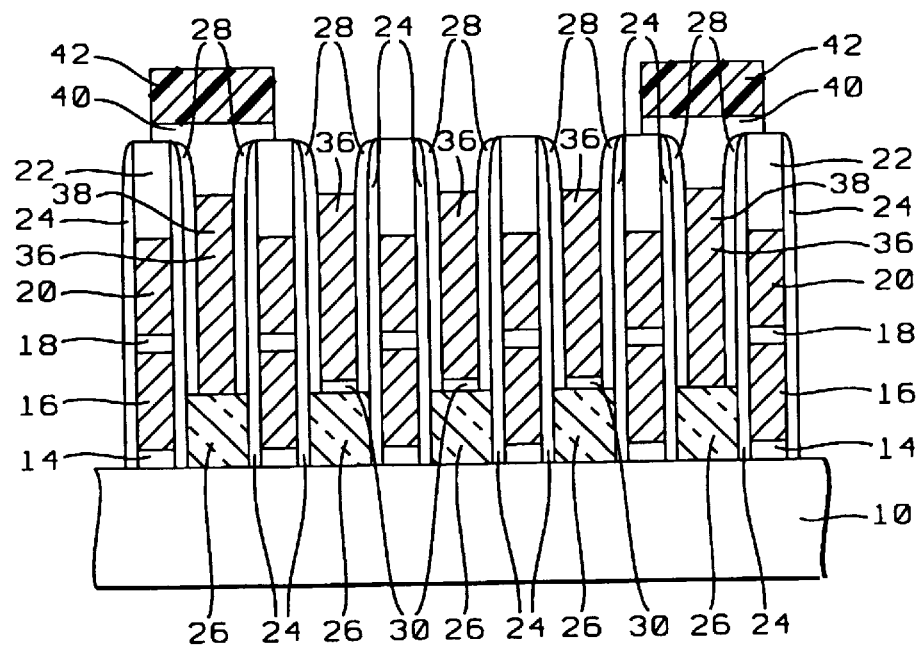
Figure 3F:
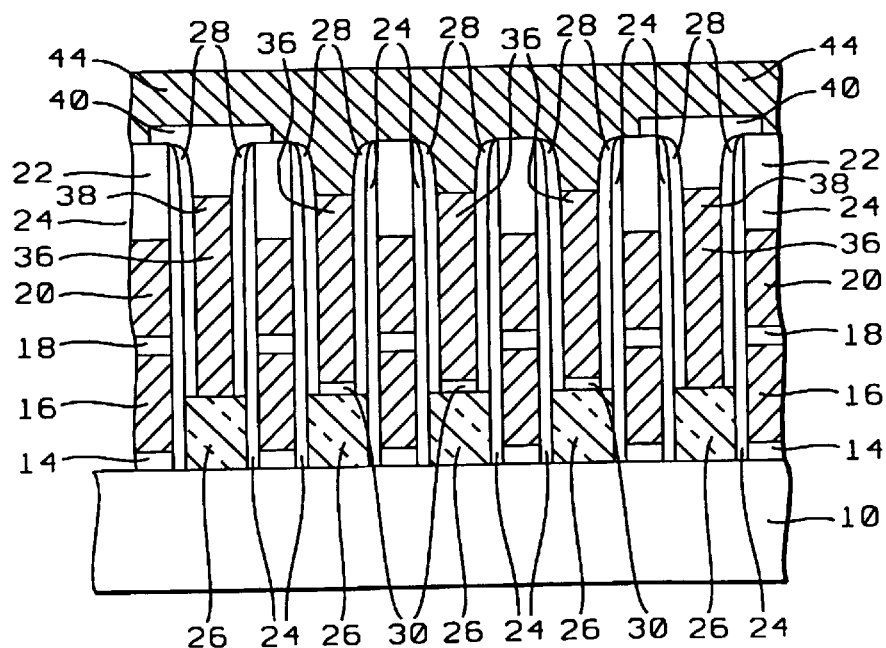

The next step is to remove the photoresist layer 32. This is followed by the deposition of a plug poly 3 layer of thickness about 3000 Angstroms, which is etched back to form plug poly 3 regions 36 that will be selected gates, and regions 38 that will be source/drain contact regions. As is apparent from FIG. 3e, the oxide 4 layer 30 is the gate oxide for the selected gates 36. The HTO oxide 3 spacer, 24, is the insulating layer separating the SEG pedestals from the floating gates. The combined thickness of the HTO oxide 3, 24, and HTO oxide 4, 26, spacers insulate selected gates, 36 and source/drain contact regions, 38 from floating gates, 16 and top gates, 20. A fifth oxide layer is now deposited, which preferably is about 500 Angstroms of HTO. Another photoresist layer is formed and patterned, 42 so as to open the selected gate areas when the HTO oxide 5 layer is etched. Upon etching only the HTO oxide layer remains, 40, that was over the source/drain contact regions, and thus under the photoresist. At this stage of the process the stricture is as shown in FIGS. 2e and 3e. After removing the photoresist layer a fourth poly layer is deposited to a thickness of about 3000 Angstroms. Another photoresist layer is formed and patterned and the poly 4 layer is etched to achieve the form shown in FIGS. 2f and 3f. Finally, the photoresist layer is removed, which completes the process.

Figure 4:
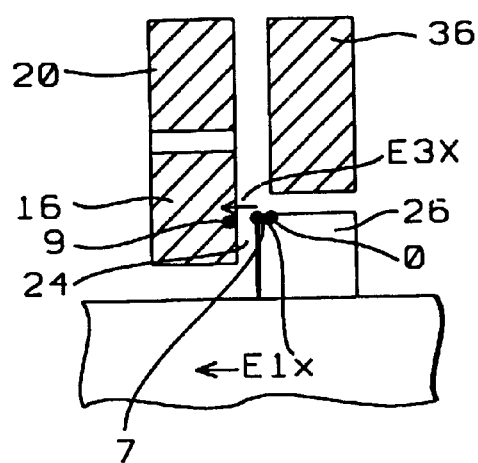
FIG. 4 shows programming by source side injection according to the invention.

Mechanisms involved in the programming operation of the novel split gate flash memory cell according to the invention are well described with the aid of FIG. 4, which includes the relevant components of the cell. In the programming operation charge is introduced into the floating gate of the split gate flash memory cell. As in traditionally programming by source side injection, the introduction of charge into the floating gate can be considered to be accomplished in two steps. In the first step, channel electrons are heated by the electric field in the SEG pedestal, so that when they reach the floating gate oxide barrier there is a significant number of electrons with increased energy. Secondly, the electrons must overcome the oxide potential barrier to pass into the floating gate. The higher the electron energy and the electric field normal to the channel the easier it is to penetrate the barrier and the more efficient the charging of the floating gate. This two step process is shown in FIG. 4. Electrons in the SEG pedestal, 26, at point 0, under selected gate 36, are accelerated by a field $E1x$ in passing to point 7, at the edge of the oxide, 24, separating the SEG pedestal and the floating gate, 16. The field $E1x$ is determined by the potential difference, V70, between points 7 and 0. The voltage of the selected gate, which should be low, determines the potential at point 0. The voltage applied to the top gate, 20, determines the voltage of the floating gate to which it is coupled. The voltage of the floating gate, which should be high, in turn determines the voltage at point 7. The larger is V70 the larger is the hot electron generation rate, the rate at which electrons gain energy. To enter the floating gate, such as by going from point 7 to point 9, channel electrons need to traverse the potential barrier posed by the oxide, 24. The rate at which electrons traverse the oxide barrier depends on the electron energy, the direction of the electron's motion relative to the barrier, and the electric field, E2x, across the barrier. The electric field E2x is determined by the voltage of the floating gate, which is determined by the voltage applied to the top gate and the thickness of oxide 24. Higher electron energy, motion more normal to the barrier and higher fields across the barrier are favorable for barrier penetration. Electron energy is determined by E1x, which, in split gate cells according to the invention, is in the same direction as E2x. Thus these two fields act in unison. Furthermore the action of E31 is to accelerate electrons in a direction normal to the oxide 24 which is the most efficient direction for barrier penetration. Having the heating field, E1x, and the barrier penetration field, E2x, in the same direction provides for maximum efficiency for source side injection. As a result of the increased efficiency in charging the floating gate for structures of the invention, lower voltages can be applied to the top gate than for traditional split gate flash cells. Lower voltages result in increased reliability, an important advantage of the split gate flash cell according to the invention.

Embodiments of the invention have been described in which essentially the entire spilt gate flash memory cell is different from a traditional memory cell. These embodiments optimize the operation and the processing of the cell. Other embodiments may leave parts of the structure unaltered. For example, SEG pedestals need not be formed in the source/drain openings, 34, but the entire source/drain opening region could be filled with poly. Thus in embodiments of the invention the basic structures of FIG. 4 are required. Essentially, there are two towers. In the floating gate tower, a gate oxide layer separates a floating gate from a silicon region and an insulating layer separates the floating gate from a top gate, and the top gate is covered by a nitride layer. In the selected gate tower, an SEG pedestal is in intimate electrical contact with the silicon region and the SEG pedestal is separated from a selected gate by an insulating layer. Along the facing sidewall the SEG pedestal is separated from the floating gate by an oxide layer and the selected gate is separated from the floating gate tower by a usually thicker oxide layer.

While the invention has been particularly shown and described with reference to the preferred embodiments thereof, it will be understood by those skilled in the art that various changes in form and detail may be made without departing from the spirit and scope of the invention.

What is claimed is:

1. A new split gate structure for improved programming efficiency comprising:
    a silicon region extending to the surface of a substrate, having parallel source/drain regions in said silicon region and electrical connecting regions disposed over said source/drain region;
    a multiplicity of structures situated between source drain regions, each composed of two tower structures and intervening oxide layers: a floating gate tower in which a first insulating layer separates a floating gate from said silicon region and a second insulating layer separates said floating gate from a top gate, with a third insulating layer disposed over the top gate; and a selected gate tower in which a silicon pedestal is in intimate electrical contact with said silicon region and said silicon pedestal is separated from a selected gate by an insulating layer, along the interfacing sidewalls the silicon pedestal is separated from the floating gate by a first intervening insulating layer and the selected gate is separated from the floating gate tower by a second intervening insulating layer.

2. The structure of claim 1 wherein said silicon region is a p-well or a part of a p substrate.

3. The structure of claim 1 wherein said source/drain regions are n-type.

4. The structure of claim 1 wherein said electrical connecting regions are polysilicon regions.

5. The structure of claim 1 wherein said first insulating layer is a gate oxide layer.

6. The structure of claim 1 wherein the thickness of said first insulating layer is between about 100 to about 200 Angstroms.

7. The structure of claim 1 wherein said floating gate is composed of polysilicon.

8. The structure of claim 1 wherein said top gate is composed of polysilicon.

9. The structure of claim 1 wherein said second insulating layer is an ONO layer.

10. The structure of claim 1 wherein said third insulating layer is a nitride layer.

11. The structure of claim 1 wherein said silicon pedestal is a SEG pedestal.

12. The structure of claim 1 wherein the height of said silicon pedestal is greater than the thickness of said first insulating layer.

13. The structure of claim 1 wherein said selected gate is composed of polysilicon.

14. The structure of claim 1 wherein said fourth insulating layer is a thermal oxide grown on the silicon pedestal surface grown to a thickness of between about 100 to about 200 Angstroms.

15. The structure of claim 1 wherein said first intervening insulating layer is an HTO oxide layer.

16. The structure of claim 1 wherein said second intervening insulating layer is an HTO oxide layer about twice the thickness of said first intervening insulating layer.

17. A new split gate memory cell structure for improved programming efficiency comprising:
    a silicon region extending to the surface of a substrate;
    parallel active regions on said silicon region defined by isolation regions;
    source/drain regions in said silicon region situated at regular intervals along the active regions, with silicon pedestals over the source/drain regions;
    first insulator regions alternating with silicon pedestals along the active regions, said first insulator regions and silicon pedestals being directly over the silicon region;
    floating gate towers, disposed over the first insulator regions, composed of floating gates that are separated from the silicon region by the first insulator regions, second insulating layers separating the floating gates from top gates that run perpendicular to the active regions and third insulator layers disposed over the top gates;
    a first sidewall insulating layer covering the sidewalls of each of said floating gate towers separating the floating gates from the silicon pedestals;
    a second sidewall insulating layer disposed over said first sidewall insulating layer, ending at the silicon pedestals;
    source/drain connecting towers disposed over silicon pedestals composed of source/drain connecting regions which run perpendicular to the active regions, are in direct electrical contact with the silicon pedestals, are separated from the floating gate towers by the combined thickness of the first sidewall insulating layers and the second sidewall insulating layers, and that are covered by a fourth insulating layer that also partially covers the tops of adjoining floating gate towers;

a multiplicity of selected gate towers between pairs of source/drain towers, each selected gate tower disposed over a silicon pedestal and is composed of a selected gate separated from the silicon pedestal by a fifth insulator layer;

a connection region providing contact to the selected gates.

18. The structure of claim 17 wherein said silicon region is a p-well or a part of a p substrate.

19. The structure of claim 17 wherein said isolation regions are shallow trench isolation regions.

20. The structure of claim 17 wherein said source/drain regions are formed by implantation of As ions at energy of about 70 keV to a dose of about 3E15 per cm2.

21. The structure of claim 17 wherein said silicon pedestals are SEG pedestals.

22. The structure of claim 17 wherein the height of said silicon pedestals are greater than the thickness of said first insulator regions.

23. The structure of claim 17 wherein said first insulator region is a thermally grown oxide layer of thickness between about 100 to about 200 Angstroms.

24. The structure of claim 17 wherein said floating gate is composed of polysilicon and whose height is about 800 Angstroms.

25. The structure of claim 17 wherein said second insulating layer that separates the floating gate from the top gate is an ONO layer, with the thickness of the bottom oxide, silicon nitride and top oxide layers being about 75, about 150 and about 30 Angstroms, respectively.

26. The structure of claim 17 wherein said top gate is composed of polysilicon and whose height is about 1000 Angstroms.

27. The structure of claim 17 wherein said third insulator layer is a nitride layer of thickness about 1500 Angstroms.

28. The structure of claim 17 wherein said first sidewall insulating layer is an HTO oxide layer.

29. The structure of claim 17 wherein said second sidewall insulating layer is an HTO oxide layer.

30. The structure of claim 17 wherein said source/drain contact regions are composed of polysilicon.

31. The structure of claim 17 wherein said fourth insulator layer is an HTO oxide layer of thickness between about 450 and about 550 Angstroms.

32. The structure of claim 17 wherein said selected gates are composed of polysilicon.

33. The structure of claim 17 wherein said fifth insulator layer is a thermal oxide grown on the silicon pedestal surface to a thickness of between about 100 to about 200 Angstroms.

34. The structure of claim 17 wherein said connection region is composed of polysilicon.

35. A method to fabricate a new split gate memory cell structure for improved programming efficiency comprising:

providing a silicon region extending to the surface of a substrate;

defining parallel active regions on said silicon region by forming isolation regions that surround said active regions;

forming a first insulator layer over said active regions;

forming a first conductor layer over said first insulator layer and patterning said first conductor layer to achieve parallel strips that are parallel to and disposed over said active regions;

forming successively three blanket layers, a second insulating layer, a second conductive layer, and a third nitride layer and patterning said three blanket layers to form parallel strips three layers deep perpendicular to the active regions and removing any of said first conductor layer that is not under said three layer deep strips;

depositing a first sidewall insulator layer and etching said first sidewall insulator layer to form first sidewall spacers;

forming silicon pedestals over exposed segments of the active regions and bounded on the sides by the first sidewall spacers;

depositing a second sidewall insulator layer;

etching said second sidewall insulator layer to form second sidewall spacers;

forming a fourth insulator layer over the silicon pedestals;

forming source/drain connection regions and selected gate regions where there can be a multiplicity n of selected gate regions between pairs of source/drain regions; and where the source/drain regions are formed by performing source/drain implants, removing the fourth insulating layer from over the silicon pedestals, forming a third conducting layer in the form of strips perpendicular to the active regions that almost fill the region above silicon pedestals bounded by second sidewall spacers and forming a fifth insulating layer that is disposed over the third conducting layer and also extends over neighboring portions of third insulator layers; and where the selected gate regions are formed by forming a fourth conducting layer in the form of strips perpendicular to the active regions that almost fill the region above silicon pedestals bounded by second sidewall spacers;

forming a fifth conducting layer in the farm of strips disposed above and parallel to the active regions.

36. The method of claim 35 wherein said silicon region is a p-well or a part of a p substrate.

37. The method of claim 35 wherein said isolation regions are shallow trench isolation regions.

38. The method of claim 35 further comprising performing a threshold voltage implant onto said active regions which can be achieved by implantation of boron ions of energy about 20 keV to a dose of about 5E11 per cm2.

39. The method of claim 35 wherein said first insulating layer is a gate oxide layer of thickness between about 100 to about 200 Angstroms.

40. The method of claim 35 wherein said first conductor layer is a polysilicon layer whose thickness can be about 800 Angstroms.

41. The method of claim 35 wherein said second insulating layer is an ONO layer, with the thickness of the bottom oxide, silicon nitride and top oxide layers being about 75, about 150 and about 30 Angstroms, respectively.

42. The method of claim 35 wherein said second conductor layer is a polysilicon layer whose thickness can be about 1000 Angstroms.

43. The method of claim 35 wherein said third insulator layer is a nitride layer whose thickness can be about 1500 Angstroms.

44. The method of claim 35 wherein said first sidewall insulator layer is a HTO oxide layer deposited to a thickness of about 300 Angstrom.

45. The method of claim 35 wherein said silicon pedestals are SEG pedestals.

46. The method of claim 35 wherein the height of said silicon pedestals are greater than the thickness of said first insulator layer.

47. The method of claim 35 wherein said second sidewall insulator layer is a HTO oxide layer deposited to a thickness of about 200 Angstrom.

48. The method of claim 35 further comprising performing a threshold voltage implant onto said silicon pedestals which can be achieved by implantation of BF2 ions of energy about 50 keV to a dose of about 4E12 per cm2.

49. The method of claim 35 wherein said fourth insulator layer is an oxide layer whose thickness is between about 100 to about 200 Angstroms.

50. The method of claim 35 wherein said source/drain implants are accomplished by implantation of As ions at energy of about 70 keV to a dose of about 3E15 per cm2.

51. The method of claim 35 wherein said third conductor layer is a polysilicon layer whose thickness can be about 3000 Angstroms.

52. The method of claim 35 wherein said fourth conductor layer is a polysilicon layer whose thickness can be about 3000 Angstroms.

53. The method of claim 35 wherein said fifth insulator layer is an HTO layer of thickness between about 450 and about 550 Angstroms.

54. The method of claim 35 wherein said fifth conducting layer is a polysilicon layer whose thickness can be about 3000 Angstroms.

* * * * *